(12) United States Patent
Dodoc et al.

(10) Patent No.: US 8,773,638 B2
(45) Date of Patent: Jul. 8, 2014

(54) MICROLITHOGRAPHIC PROJECTION EXPOSURE APPARATUS WITH CORRECTION OPTICAL SYSTEM THAT HEATS PROJECTION OBJECTIVE ELEMENT

(75) Inventors: Aurelian Dodoc, Heidenheim (DE); Sascha Bleidistel, Aalen (DE); Olaf Conradi, Westhausen/Westerhofen (DE); Arif Kazi, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 708 days.

(21) Appl. No.: 12/727,482

(22) Filed: Mar. 19, 2010

(65) Prior Publication Data
US 2010/0231883 A1    Sep. 16, 2010

Related U.S. Application Data

(63) Continuation of application No. PCT/EP2008/008251, filed on Sep. 29, 2008.

(30) Foreign Application Priority Data

Oct. 9, 2007  (EP) .................................. 07019674

(51) Int. Cl.
*G03B 27/54*    (2006.01)
(52) U.S. Cl.
USPC ............................................................ 355/70
(58) Field of Classification Search
USPC ......................................... 355/70, 67, 30, 53
See application file for complete search history.

(56) References Cited

U.S. PATENT DOCUMENTS

| 5,229,872 | A |   | 7/1993  | Mumola |
|-----------|---|---|---------|--------|
| 5,296,891 | A |   | 3/1994  | Vogt et al. |
| 5,523,193 | A |   | 6/1996  | Nelson |
| 6,338,823 | B1 |  | 1/2002  | Furukawa |
| 6,466,382 | B2 | * | 10/2002 | Muller-Rissmann et al. 359/820 |
| 6,504,597 | B2 |  | 1/2003  | Schuster et al. |

(Continued)

FOREIGN PATENT DOCUMENTS

| EP | 0 823 662 | 2/1998 |
|----|-----------|--------|
| EP | 1 113 336 | 7/2001 |

(Continued)

OTHER PUBLICATIONS

Japanese Office Action and its English translation, for corresponding JP Application No. 2010-528290, dated Oct. 11, 2012.

*Primary Examiner* — Chia-how Michael Liu
(74) *Attorney, Agent, or Firm* — Fish & Richardson P.C.

(57) ABSTRACT

A microlithographic projection exposure apparatus includes a primary illumination system producing projection light, a projection objective and a correction optical system. The correction optical system includes a secondary illumination system, which produces an intensity distribution of correction light in a reference surface, and a correction element which includes a heating material and is arranged in a plane that is at least substantially optically conjugate to the reference surface such that the correction light and the projection light pass through at least one lens contained in the projection objective before they impinge on the correction element. All lenses through which both the correction light and the projection light pass are made of a lens material which has a lower coefficient of absorption for the correction light than the heating material contained in the correction element.

23 Claims, 11 Drawing Sheets

(56) References Cited

U.S. PATENT DOCUMENTS

| | | |
|---|---|---|
| 6,781,668 B2 | 8/2004 | Schuster et al. |
| 2001/0019403 A1 | 9/2001 | Schuster et al. |
| 2002/0126400 A1 | 9/2002 | Muller-Rissmann et al. |
| 2005/0018269 A1 | 1/2005 | Weiss et al. |

FOREIGN PATENT DOCUMENTS

| | | |
|---|---|---|
| EP | 1 376 092 | 1/2004 |
| JP | 09-329742 | 12/1997 |
| JP | 10-050585 | 2/1998 |
| JP | 10-064790 | 3/1998 |
| JP | 2001-196304 | 7/2001 |
| JP | 2001-196305 | 7/2001 |
| WO | WO 03/075096 | 9/2003 |
| WO | WO 2004/019128 | 3/2004 |
| WO | WO 2005/022614 | 3/2005 |
| WO | WO 2005/069055 | 7/2005 |
| WO | WO 2007/017089 | 2/2007 |

* cited by examiner

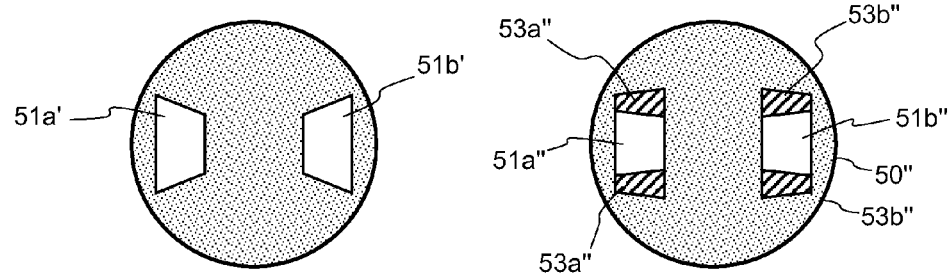
FIG. 3a    FIG. 3b
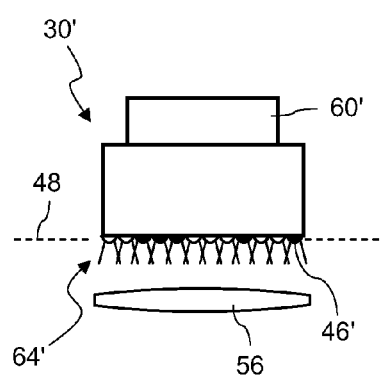
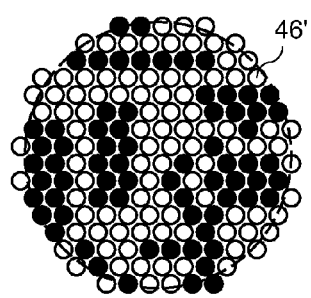
FIG. 4    FIG. 5

MICROLITHOGRAPHIC PROJECTION EXPOSURE APPARATUS WITH CORRECTION OPTICAL SYSTEM THAT HEATS PROJECTION OBJECTIVE ELEMENT

CROSS-REFERENCE TO RELATED APPLICATIONS

This application is a continuation of, and claims benefit under 35 USC 120 to, international application PCT/EP2008/008251, filed Sep. 29, 2008, which claims benefit of European Application No. 07019674.6, filed Oct. 9, 2007. International application PCT/EP2008/008251 is hereby incorporated by reference in its entirety.

FIELD

The disclosure relates to microlithographic projection exposure apparatus. Such apparatus are used for the production of large-scale integrated circuits and other microstructured components. The disclosure relates in particular to correction systems for reducing or symmetrizing rotationally asymmetric image errors that occur in projection objectives of such apparatus.

BACKGROUND

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. In general, at each layer of the fabrication, the wafer is first coated with a photoresist which is a material that is sensitive to radiation, such as deep ultraviolet (DUV) light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system, a mask alignment stage for aligning the mask, a projection lens and a wafer alignment stage for aligning the wafer coated with the photoresist. The illumination system illuminates a field on the mask that may have the shape of a rectangular slit or a narrow ring segment, for example.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or simply scanner, each target portion is irradiated by progressively scanning the mask pattern under the projection light beam in a given reference direction while synchronously scanning the substrate parallel or antiparallel to this direction. The ratio of the velocity of the wafer and the velocity of the mask is equal to the magnification $\beta$ of the projection lens, which is usually smaller than 1, for example $\beta=\frac{1}{4}$ or $\beta=\frac{1}{100}$.

It is to be understood that the term "mask" (or reticle) is to be interpreted broadly as a patterning device. Commonly used masks contain transmissive or reflective patterns and may be of the binary, alternating phase-shift, attenuated phase-shift or various hybrid mask type, for example. However, there are also active masks, e.g. masks realized as a programmable mirror array. An example of such a device is a matrix-addressable surface having a viscoelastic control layer and a reflective surface. More information on such mirror arrays can be gleaned, for example, from U.S. Pat. No. 5,296,891 and U.S. Pat. No. 5,523,193. Also programmable LCD arrays may be used as active masks, as is described in U.S. Pat. No. 5,229,872. For the sake of simplicity, the rest of this text may specifically relate to apparatus including a mask and a mask stage; however, the general principles discussed in such apparatus should be seen in the broader context of the patterning device as hereabove set forth.

One of the aims in the development of projection exposure apparatus is to be able to lithographically generate structures with smaller and smaller dimensions on the wafer. Small structures lead to high integration densities, which generally has a favorable effect on the performance of the microstructured components produced with the aid of such apparatus.

The size of the structures which can be generated often depends primarily on the resolution of the projection objective being used. Since the resolution of projection objectives is inversely proportional to the wavelength of the projection light, one way of increasing the resolution is to use projection light with shorter and shorter wavelengths. The shortest wavelengths currently used are 248 nm, 193 nm or 157 nm and thus lie in the (deep) ultraviolet spectral range.

Another way of increasing the resolution is based on the idea of introducing an immersion liquid with a high refractive index into an immersion interspace, which remains between a last lens on the image side of the projection objective and the photoresist or another photosensitive layer to be exposed. Projection objectives which are designed for immersed operation, and which are therefore also referred to as immersion objectives, can achieve numerical apertures of more than 1, for example 1.4 or even higher.

The correction of image errors (i.e. aberrations) is becoming increasingly important for projection objectives with very high resolution. Different types of image errors usually involve different correction measures.

The correction of rotationally symmetric image errors is comparatively straightforward. An image error is referred to as being rotationally symmetric if the wavefront deformation in the exit pupil is rotationally symmetric. The term wavefront deformation refers to the deviation of a wave from the ideal aberration-free wave. Rotationally symmetric image errors can often be corrected, for example, at least partially by moving individual optical elements along the optical axis.

Correction of those image errors which are not rotationally symmetric can be more difficult. Such image errors occur, for example, because lenses and other optical elements heat up rotationally asymmetrically. One image error of this type is astigmatism, which may also be encountered for the field point lying on the optical axis.

A major cause for rotationally asymmetric image errors is a rotationally asymmetric, in particular slit-shaped and/or off-axis, illumination of the mask, as is typically encountered in projection exposure apparatus of the scanner type. The slit-shaped illuminated field causes a non-uniform heating of those optical elements that are arranged in the vicinity of field planes. This heating results in deformations of the optical elements and, in the case of lenses and other elements of the refractive type, in changes of their index of refraction. If the materials of refractive optical elements are repeatedly exposed to the high energetic projection light, also permanent material changes are observed. For example, a compaction of the materials exposed to the projection light sometimes occurs, and this compaction results in local and permanent changes of the index of refraction.

The heat induced deformations and index changes alter the optical properties of the optical elements and thus cause image errors. Heat induced image errors often have a twofold symmetry. However, image errors with other symmetries, for example threefold or fivefold, or image errors characterized by completely asymmetric wavefront deformations are also frequently observed in projection objectives. Completely asymmetric image errors are often caused by material defects which are statistically distributed over the optical elements contained in the projection objective.

Another major cause for rotationally asymmetric image errors are certain asymmetric illumination settings in which the pupil plane of the illumination system is illuminated in a rotationally asymmetric manner. Important examples for such settings are dipole settings in which only two poles are illuminated in the pupil plane. With such a dipole setting, also the pupil planes in the projection objective contain only two illuminated regions. Consequently, the lenses arranged in or in the vicinity of such an objective pupil plane are exposed to a rotationally asymmetric intensity distribution which gives rise to rotationally asymmetric image errors. Also quadrupol settings often produce rotationally asymmetric image errors, although to a lesser extent than dipole settings.

SUMMARY

The disclosure provides a microlithographic projection exposure apparatus including a correction device that very efficiently corrects or symmetrizes wavefront deformations in general, and in particular rotationally asymmetrical wavefront deformation as they often occur, for example as a result of a rotationally asymmetric heating of optical elements by the projection light.

The microlithographic projection exposure apparatus can include a primary illumination system which produces an intensity distribution of projection light in a mask plane, a projection objective and a correction optical system. The correction optical system includes a secondary illumination system, which produces an intensity distribution of correction light in a reference surface, and a correction element. The correction element includes a heating material and is arranged in a surface that is at least substantially optically conjugate to the reference surface such that the correction light and the projection light pass through at least one lens contained in the projection objective before they impinge on the correction element. All lenses through which both the correction light and the projection light pass are made of lens materials which have a lower coefficient of absorption for the correction light than the heating material of the correction element.

As a result of this material choice, the correction light heats up the correction element more than the other lenses of the projection objective through which the correction light propagates. The selectivity of this heating depends, among other things, on how much the coefficient of absorption of the heating material exceeds the coefficient of absorption of the optical materials of these other lenses. The other lenses may not significantly heated up at all, and the energy of the correction light is almost exclusively dissipated in the correction element. To this end the coefficient of absorption of the heating material should, for the correction light, be at least 2 times, such as at least 5 times, greater than the coefficient of absorption of the lens material having the highest coefficient of absorption among the lens materials of the other lenses.

According to the disclosure, the correction element is arranged in a surface which is optically conjugated to the reference surface. Thus the intensity distribution of the correction light in the reference surface is imaged on the correction element. This makes it possible not only to selectively heat up the correction element as a whole (as shown in FIG. 14), but also to heat up selected portions of this correction element. These portions are determined such that the temperature distribution within the correction element changes in a predetermined manner, and these changes modify the optical properties of the correction element in such a way that image errors produced by other optical elements contained in the projection objective are reduced or at least symmetrized.

The effects produced by the changed temperature distribution include deformations of the correction element and changes of its refractive index distribution. Which of these two effects predominates usually depends on the geometry of the correction element and the optical materials contained therein. Certain measures may be taken to reduce deformations of the correction element so that the local heating by the correction light has mainly the effect of changing the refractive index distribution within the correction element or a portion thereof. On the other hand, things may be arranged such that heating induced deformations prevail and the refractive index variations can be neglected. If only one of the two effects predominates, this usually facilitates the prediction how changes of the temperature distribution will affect an optical wavefront propagating through the correction element so that the desired correction effect is achieved.

The term "correction" used here and generally in the context of the present disclosure is meant to denote a substantial general reduction of image errors and/or a symmetrization of rotationally asymmetric image errors. Symmetrization means in this context that the asymmetry of the wavefront deformation is reduced. As has been mentioned further above, an at least substantially rotationally symmetrical wavefront deformation may be corrected with other conventional correction measures, for example the displacement of certain optical elements along an optical axis of the projection objective. Thus a "correction" in the context of the disclosure may even be achieved if the rotationally asymmetric components of image errors are reduced although rotationally symmetric components are simultaneously increased.

One further advantage of the optical conjugation between the reference surface and the surface, in which the correction element is arranged, is that it is, at least in principle, possible (if desired) to illuminate in one go every arbitrary point on the optical surface of the correction element. This only involves the reference surface being sufficiently illuminated and that no other optical elements obstruct the correction light beam path. Such obstructions may be formed, for example, by beam splitting cubes which are arranged in a pupil plane of the objective and direct a portion of the light towards a sensor.

If the correction light is completely absorbed in the correction element, it cannot impinge on the photoresist or any other layer that is arranged in an image plane of the projection objective and is sensitive to the projection light. Nevertheless it may be desirable to select the correction light and/or this layer such that the layer is not sensitive to the correction light. This ensures that correction light which is reflected, scattered or not completely absorbed by the correction element and eventually impinges on the layer, does not contribute to the exposure of the layer which would result in a deterioration of the imaging of the mask.

The correction light has to differ from the projection light in some respect in order to ensure that the correction element significantly absorbs the correction light, but not the projection light. The projection light and the correction light may differ, for example, with respect to their state of polarization if the coefficient of absorption of the heating material is polarization dependent.

Usually, however, it will be easier if the projection light and the correction light have different wavelengths. For example, the projection light may have a wavelength which is smaller than 250 nm, and the correction light may contain a wavelength component having a wavelength above 2 µm. With such wavelength, there is a number of material combinations containing one material which is transparent both for the projection light and the correction light, and another material which is transparent only for the projection light, but not for the correction light.

One example of such a material combination is synthetic quartz ($SiO_2$) for the heating material and calcium fluoride ($CaF_2$) for the lens materials. If the correction light contains a light component having a wavelength between 4.5 µm and 6 µm, calcium fluoride as lens material is transparent both for the correction light and the projection light. Synthetic quartz, however, is transparent only up to a wavelength of about 4.0 µm and would thus absorb any light component of the correction light having a wavelength between 4.5 µm and 6 µm.

If synthetic quartz has an OH concentration of more than about 500 ppm, it has an additional absorption window between about 2.65 µm and 2.85 µm. In this case the correction light may contain a light component having a wavelength between about 2.65 µm and 2.85 µm.

The same materials are also suitable if the projection light has a wavelength which is above 190 nm and the correction light contains a light component having a wavelength below 180 nm. Also in this case calcium fluoride is transparent both for the correction light and the projection light, but synthetic quartz absorbs the correction light.

The correction element may be formed by a mirror or a refractive optical element. In the case of a mirror, a mirror support supports a reflective coating which is reflective for the projection light, but not for the correction light. Since multilayer reflective coatings are specifically designed for a specific design wavelength, the reflectivity of such coatings significantly drops to very low values for wavelengths which differ from the design wavelength. The bulk material of the mirror support should absorb the correction light which has passed through the reflective coating. In this case deformations of the mirror support will be the most prominent effect that changes the optical properties of the mirror. An additional coating may be provided which is highly absorptive for the correction light. If infrared radiation is used as correction light, such a coating may simply be formed by a black paint applied on the mirror support.

In another embodiment the correction element is a refractive optical element. Such a refractive optical element may be formed as a lens or a plane-parallel plate, for example. The correction element may completely consist of the heating material, or it may include a substrate made of the heating material and some kind of coating, for example an anti-reflection coating that reduces the coefficient of reflection for the projection light.

Another alternative is to use a substrate made of one of the lens materials and to apply a layer on the substrate, wherein the layer contains the heating material. Since the layer will usually have a small thickness, this involves a heating material which has a very large coefficient of absorption for the correction light.

At the optimum position of the correction elements within the projection objective it is sometimes not desired to have any refractive power. In these cases it may be desirable to have a correction element which forms a plane-parallel plate. Such a plate has also the advantage that heat induced deformations are easier to predict. The reference surface may then be plane as well. In other embodiments, the reference surface is curved, but the optical conjugation between the reference surface images this curved reference surface onto a plane in which the correction element is arranged. Generally, the shape of the reference surface may be adapted to the shape of the correction element.

The image errors to be corrected are often field position independent. This means that the wavefront deformations to be corrected are identical for all points in the image field. In this case it is desirable to arrange the correction element in or in close proximity of a pupil plane of the projection objective, because then all wavefronts converging towards image points completely overlap in the pupil and thus can be corrected commonly. Here the term "close proximity" is defined by axial distances from the pupil plane at which the ratio $P=h_{mr}/h_{cr}>3$, such as with $P>5$, wherein $h_{mr}$ is the height of a marginal ray that emerges from a point on the optical axis, and $h_{cr}$ is the height of a chief ray that impinges on a marginal image point.

If the correction element is positioned in or in close proximity to a pupil plane, the correction optical system may include a condenser that establishes a Fourier relationship between the reference surface and the mask plane or a plane which is optically conjugate to the mask plane, for example an intermediate image plane in the projection objective or a field plane contained in the primary illumination system. Since only correction light but no projection light propagates through the condenser, the optical materials contained therein may be specifically adapted to the correction light, because there is no need to transmit also the projection light.

If field dependent image errors shall be reduced, the correction element should be arranged in or in close proximity to a field plane, for example an intermediate image plane of the projection objective. If combinations of field dependent and field independent image errors are to be corrected, positions between a pupil plane and a field plane should be envisaged for the correction element.

There are cases in which there is either no correction of wavefront deformations involved at all, or a correction is involved, but then at constant level. Such a situation may occur, for example, if either a rotationally symmetric illumination setting (for example conventional or annular settings) or only one specific rotationally asymmetric illumination setting (for example a dipole illumination setting) is used in a wafer stepper. If the illumination setting is changed from a rotationally symmetric setting to the rotationally asymmetric setting, lenses in the vicinity of pupil planes of the projection objective are illuminated in a rotationally asymmetric manner, which usually gives rise, after some time, to rotationally asymmetric wavefront deformations which involve correction. Then the correction device of the disclosure may be switched on, and a fixed suitable intensity distribution in the reference surface may be imaged to a correction element positioned in or in close proximity to a pupil plane.

In many cases, however, it will be desirable to be able to adjust the intensity distribution in the reference surface. It is then possible to vary the correction effect produced by the correction element depending on the correction demand. This demand may change over time, because other illumination settings are used, other masks are projected, or because of ageing phenomena.

For varying the intensity distribution in the reference surface, the correction optical system may include a spatial light modulator. Such a light modulator may include a light source and a stop device having a variable configuration of apertures. This configuration of apertures may be varied by moving stop blades or by exchanging the stop device. To this end the stop device may include a plurality of stop elements, which have different configurations of apertures, and an exchange holder for receiving one of the stop elements.

An even further increased flexibility in producing different intensity distributions in the reference surface is achieved with a spatial light modulator that includes a plurality of light emitting elements arranged in the reference surface. With the help of a suitable control unit, the light emitting elements, for example LEDs or ends of optical fibers into which correction light is coupled at the opposite end, almost any arbitrary geometrical configuration of an intensity distribution may be produced. The "resolution" is only restricted by the number of light emitting elements used in the correction device.

Another approach to produce a variable intensity distribution in the reference surface is the use of a spatial light modulator which includes a plurality of tiltable mirror elements arranged in the reference surface and illuminated by a light source of the secondary illumination system. Such mirrors may be configured such that they are either in an "on"-state or "off"-state in which no light is reflected such that it can reach the correction element. Such tiltable mirror elements may be arranged in an array and be configured as a microelectric mechanical system (MEMS), and in particular as a digital micro-mirror device (DMD).

If a spatial light modulator is used, it may be controlled by a control unit which is configured to determine the intensity distribution in the reference surface depending on an input quantity which relates to at least one of the following entities: Illumination setting set in the primary illumination system, temperature distribution of at least one lens contained in the projection objective, and imaging quality of the projection objective. The input quantity may include measured quantities such as temperatures, and/or it may include computed quantities. For example, the imaging quality of the projection objective may be computed based on input variables such as illumination setting, time or mask configurations. Alternatively, the image quality may be measured using a measuring instrument, for example a CCD sensor arranged in an image plane of the projection objective, or an interferometric measurement device.

It may be desirable to illuminate the correction elements such that all points to be illuminated by the correction light receive at least substantially correction light having the same angular distribution. This is because the coefficient of reflection may depend on the angle of incidence, and thus it may matter whether light impinges obliquely or perpendicularly onto a point on the surface of the correction element.

For achieving a controlled, and in particular homogenous, angular distribution of correction light impinging on the correction element, it may be considered to include an optical integrator into the correction optical system, wherein the integrator has a light exit surface which is arranged at least substantially in the reference surface. Such optical integrators often include at least one array of optical microlenses and increase the geometrical optical flux.

Often it will be difficult to feed the correction light into the projection objective such that the correction light also passes through the mask. Particularly in the case of projection exposure apparatus of the scanner type there is hardly any free area in the mask plane which is not obstructed by the mask, but is nevertheless within the area which is imaged by the projection objective onto the light sensitive layer.

In such cases it may be advantageous to provide a beam folding element that feeds correction light into a beam path of the projection objective. The beam folding element may include, for example, a mirror or a prism containing a reflective surface. A beam folding element makes it possible to find better arrangements of the secondary illumination system within a projection exposure apparatus. For example, the beam folding elements may be arranged between the mask plane in the projection objective so that the correction light does not have to pass through the mask or an area immediately surrounding the mask. Instead, the beam folding element folds the mask plane such that it is better accessable for the secondary illumination system.

BRIEF DESCRIPTION OF THE DRAWINGS

Various features and advantages of the present disclosure may be more readily understood with reference to the following detailed description taken in conjunction with the accompanying drawings in which:

FIGS. 3a and 3b are top views on stop elements that may be inserted into an exchange holder which is contained in the correction optical system shown in FIG. 2;

FIG. 4 is a meridional section through a secondary illumination system of the correction optical system according to a first embodiment;

FIG. 5 is a bottom view on an array of light emitting diodes contained in the secondary illumination system shown in FIG. 4;

DETAILED DESCRIPTION

1. First Group of Embodiments

Figure 1:
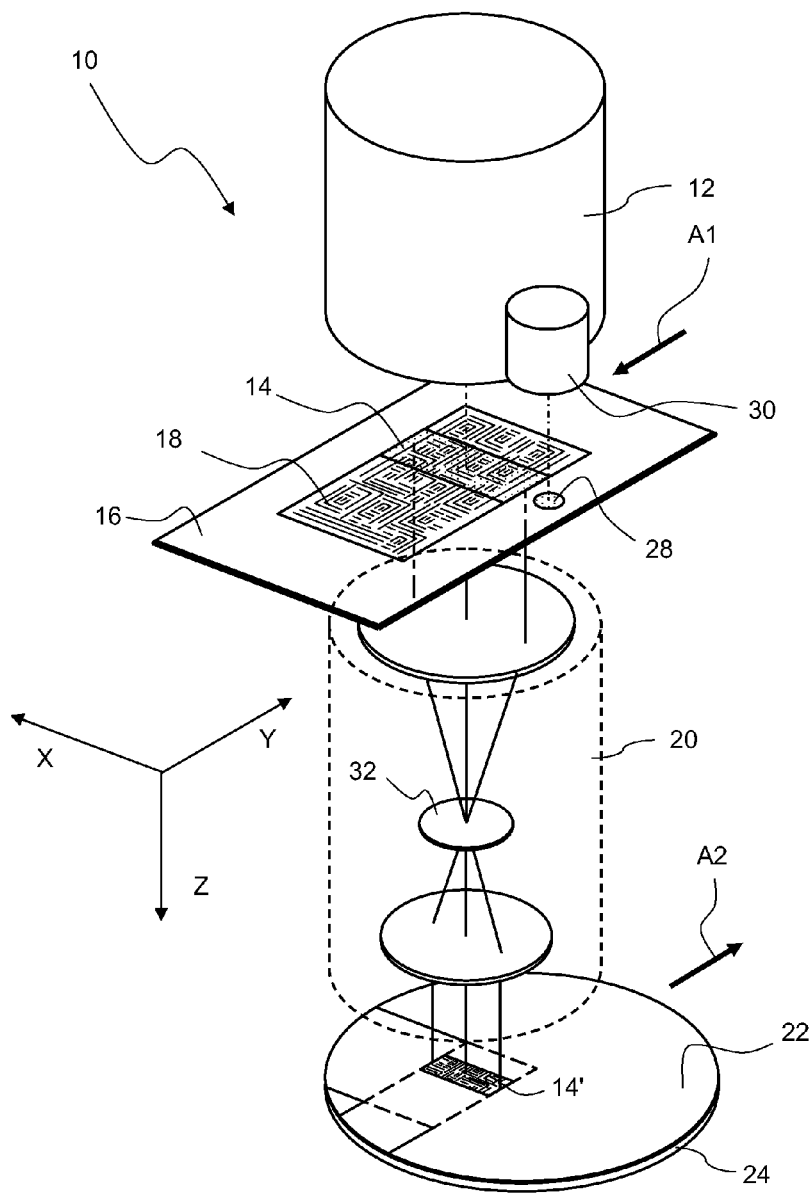
FIG. 1 is a perspective simplified view of a projection exposure apparatus in accordance with the present disclosure.

FIG. 1 is a perspective and highly simplified view of a projection exposure apparatus 10 that includes a primary illumination system 12 for producing a projection light bundle. The projection light bundle illuminates a field 14 on a mask 16 containing minute structures 18. In this embodiment, the illuminated field 14 has the shape of a rectangle. However, other shapes of the illuminated field 14, for example ring segments, are contemplated as well.

A projection objective 20 images the structures 18 within the illuminated field 14 onto a light sensitive layer 22, for example a photoresist, which is deposited on a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification of less than 1, a minified image 14' of the structures 18 within the illuminated field 14 is projected onto the light sensitive layer 22.

During the projection, the mask 16 and the substrate 24 move along a scan direction which coincides with the Y direction. Thus the illuminated field 14 scans over the mask 16 so that structured areas larger than the illuminated field 14 can be continuously projected. Such a type of projection exposure apparatus is often referred to as "step-and-scan tool" or simply a "scanner". The ratio between the velocities of the mask 16 and the substrate 24 is equal to the magnification of the projection objective 20. If the projection objective 20 inverts the image, the mask 16 and the substrate 24 move in opposite directions, as this is indicated in FIG. 1 by arrows A1 and A2. However, the present disclosure may also be used in stepper tools in which the mask 16 and the substrate 24 do not move during projection of the mask.

In the embodiment shown, the illuminated field 14 is centered with respect to an optical axis 26 of the projection objective 20. In other embodiments, the illuminated field 14 is not centered with respect to the optical axis 26. An off-axis illuminated field 14 may be involved with certain types of projection objectives 20, for example the objective shown in FIG. 9 which contains one or more truncated mirrors.

The projection exposure apparatus 10 includes a correction optical system for reducing image errors. Causes for the image errors to be corrected may be constant or time dependent. Constant causes include design deficiencies, impurities or other faults in lens materials or anti-reflection coatings, and mounting tolerances. Time dependent causes include variable outer conditions such as air pressure and temperature, certain ageing phenomena such as material compaction caused by the high energy projection light, and deformations and refractive index changes induced by temperature changes that are caused by the absorption of projection light within lens materials.

Image errors are often described with respect to wavefront deformations. The wavefront of the light waves converging to a particular point in the image plane are considered and compared with an ideal wavefront. The deformations observed may be rotationally symmetrical or rotationally asymmetrical. Apart from that, the wavefront deformations may be identical for all points in the image plane, or may be different for some or each of these points. The correction optical system provided in the projection exposure apparatus 10 may be configured such that any of the aforementioned wavefront deformations may be substantially reduced.

In the embodiment shown in FIG. 1, however, the correction optical system is configured such that only those image errors are corrected that are at least substantially field independent. This means that the wavefront deformations are identical for all points in the image plane. To this end the correction optical system includes as main components a secondary illumination system 30 and a correction element 32 which is positioned in a pupil plane of the projection objective 20. The secondary illumination system 30 produces correction light which passes through an unstructured area 28 of the mask 16 and enters the projection objective 20. It then selectively illuminates certain portions of the correction element 32.

The portions illuminated on the correction element 32 heat up, which causes changes of the refractive index and/or deformations of the correction element 32. These changes and/or deformations are determined such that the wavefronts passing through the correction element 32 are subjected to deformations that at least substantially offset those deformations which are caused by the other optical elements contained in the projection objective 20 as a result of the causes mentioned further above. Then the optical wavefronts that emerge from the projection objective 20 and converge towards the image points are at least substantially spherical and therefore free of errors.

In the following the correction optical system will be described in more detail with reference to FIG. 2 which is a simplified meridional section through the correction optical system. First, however, the portion of the projection objective 20 shown in FIG. 2 will be described.

The projection objective 20 includes a positive lens 34 which establishes a Fourier relationship between a mask plane 36, in which the mask 18 is arranged during the projection, and a pupil plane 38 of the projection objective 20. As a result of this Fourier relationship, all light rays emerging from a particular point in the mask plane 36 pass through the pupil plane 38 nearly under the same angle, i.e. as parallel light. This is illustrated in FIG. 2 for a point 40 at an edge of the mask 18, from which light rays 42a, 42b, 42c emerge. The further away the point is from the optical axis 26 of the projection objective 20, the larger is the angle under which the light rays pass through the pupil plane 38. Thus all light rays emerging from a point on the optical axis 26 in the mask plane 36 perpendicularly intersect the pupil plane 38 (see exemplary light ray 44). The Fourier relationship also involves that the light bundles emerging from points in the mask plane 36 overlap in the pupil plane 38. With the help of an aperture stop 43 it is possible to restrict the numerical aperture of the projection objective 20 to a desired value and to avoid vignetting effects.

The correction optical system includes a secondary illumination system 30 which includes, in the embodiment shown, a two-dimensional array of light emitting elements 46. The correction optical system has a reference plane 48 which is illuminated by the light emitting elements 46 and in which a stop element 50 having a plurality of apertures 51a, 51b, 51c is received in an exchange holder 54.

The correction optical system further includes a condenser 56 which is formed, in this embodiment, by a single lens. The condenser 56 establishes a Fourier relationship between the reference plane 48, in which the stop element 50 is arranged, and the mask plane 36. Part of the correction optical system is also the positive lens 34 of the projection objective. The combination of the condenser 56 and the positive lens 34 forms an objective which optically conjugates the reference plane 48 to the pupil plane 38. This is equivalent to saying that the reference plane 48 is imaged onto the pupil plane 38 of the projection objective 20.

Due to this imaging, the stop element 50 is imaged onto the pupil plane 38. In or in close proximity to this pupil plane 38 the correction element 32 is arranged so that an image of the stop element 50 is formed on the correction element 32. Thus bright spots 52a, 52b and 52c, which are images of the illuminated apertures 51a, 51b, 51c, respectively, are formed on the correction element 32.

In the embodiment shown, the correction element 32 is formed by a plane parallel plate. Those portions of the correction element 32, through which the correction light produced by the light emitting elements 46 passes, heat up as a result of absorption of the correction light in-side the material of the correction element 32. As has been mentioned above, this absorption results in changes of the refractive index and/or local deformations of the correction element 32 so that optical wavefronts passing through the correction element 32 are subject to corrective deformations.

Usually it will be desirable to produce these effects only in the correction element 32, but not in the positive lens 34 through which the correction light also passes. If the positive lens 34 also absorbs a substantial amount of the correction light, it will itself be subject to refractive index changes and/or deformations which cause additional image errors. Then it becomes much more difficult to determine a temperature distribution in the correction element 32 such that also those image errors are substantially corrected that are produced by the correction light itself.

There are different approaches to achieve that correction light is mainly absorbed in the correction element 32. In one embodiment the projection light is in a first linear state of polarization, and the correction light is in a second linear state of polarization which is orthogonal to the first linear state of polarization. A linear polarization of the correction light may be achieved, for example, with an additional polarizer inserted in the reference plane 48.

Then the correction element 32 may be provided with a layer which absorbs only light which is in the second linear state of polarization, but not in the first linear state of polarization. To this end the correction element may include a polarizer that absorbs only the correction light being in the second state of polarization. Such a polarizer may include elongated minute structures extending perpendicular to the plane of vibration of the correction light. In this case it has to be ensured that substantially all correction light is absorbed in the correction element 32 so as to prevent correction light from impinging on the light sensitive layer 22 on the support 24.

Another approach would be to use correction light which has a different wavelength (or a range of wavelengths) as the projection light. In this approach the materials for the positive lens 34 and the correction element 32 are identical and determined such that the coefficient of absorption is higher for the correction light than for the projection light. If the positive lens 34 is thin and the correction element 32 is thick, only a small amount of light will be dissipated in the lens 34. In the thick correction element 32 more heat will be dissipated, and since the surfaces at which the elements can cool down are almost identical, the correction element will heat up more strongly than the lens 34. However, this approach works well only if there are very few thin lenses through which the correction light passes before it impinges on the correction element 32.

In the following another approach will be described that makes it possible to almost exclusively heat up the correction element 32 without affecting the lens 34. In accordance with this approach the correction light has a different wavelength or a range of wavelengths than the projection light. Furthermore, the positive lens 34 and the correction element 32 are made of different optical materials. The optical material of the positive lens 34 is determined such that it has a very low coefficient of absorption both for the projection light and the correction light. However, the optical material of the correction element 32 is determined such that it has a low coefficient of absorption for the projection light, but a high coefficient of absorption for the correction light.

As a result of this combination of wavelengths and optical materials, the correction light passes through the lens 34 and the correction element 32 more or less unattenuated, but the correction light can only pass the lens 34, but is absorbed in the correction element 32. As a result, the projection light and the correction light heat up the lens 34 only to a small extent. The correction element 32, however, is significantly heated up by the correction light and produces the desired correction effects on the wavefronts.

As a matter of course, the absorption of the correction light does not have to occur exclusively in the bulk material of the correction element 32. It suffices that the correction element 32 contains an optical material which has a higher coefficient of absorption for the correction light than the lens 34. This material may be formed as a layer on a substrate, may be sandwiched between two substrates, or may even be interspersed among another optical material.

In the embodiment shown the correction element 32 is formed as a plane parallel plate, but various other shapes are contemplated as well. For example, the correction element may be a lens having a refractive power, it may be formed as a thicker cube or cylinder, or it may even be formed as a thin film or membrane extending within a frame which holds the membrane.

Figure 2:
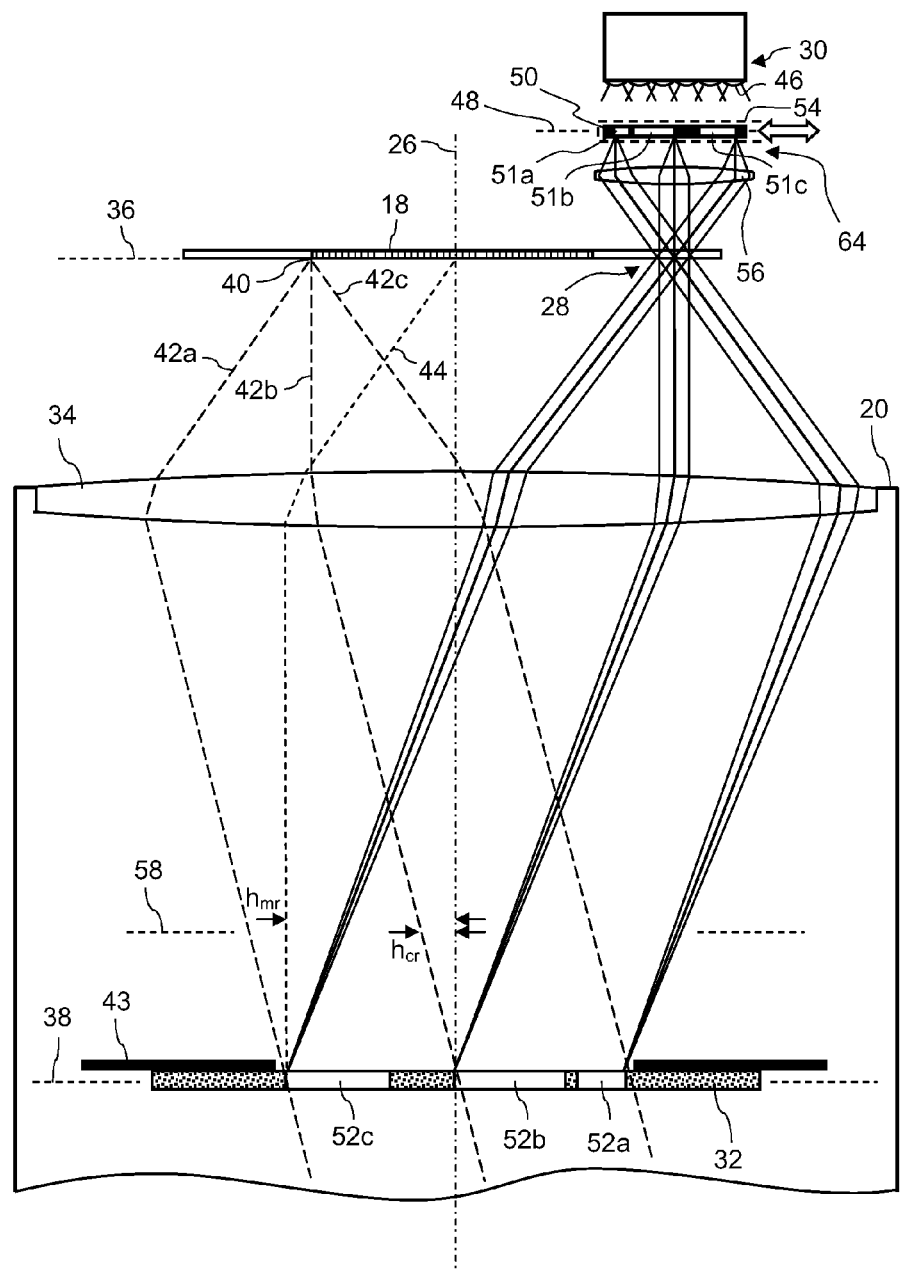
FIG. 2 is a meridional section through a correction optical system contained in the projection exposure apparatus shown in FIG. 1.

From FIG. 2 it also becomes clear that the correction element 32 does not necessarily have to be arranged precisely in the pupil plane 38. For correcting a field independent image error it suffices that the correction element 32 is positioned in close proximity to the pupil plane 38. If the correction element 32 is positioned outside the pupil plane 38, the optical effect achieved with the correction element 32 may slightly differ for different image points. However, such slight differences can often be tolerated. In order to achieve an at least approximately field independent correction effect, the actual distances between the correction element 32 and the pupil plane 38 should not exceed a value at which a ratio P is below 3, where $P=h_{mr}/h_{cr}$. For example, the ratio P may exceed 5. The quantity $h_{mr}$ denotes the distance (often referred to as height) between the optical axis 26 and a point where a marginal ray 44 that emerges from a point on the optical axis penetrates the correction element 32. The quantity $h_{cr}$ denotes the distance or height between the optical axis 26 and a point where a chief ray 42b that impinges on a marginal image point (see FIG. 2) penetrates the correction element 32. The larger the ratio P is, the closer the correction element 32 is arranged to the pupil plane 38. For example, at plane 58 indicated with broken lines in FIG. 2 the ratio P=3.4. Thus the correction element 32 may also be arranged in plane 58 without significantly reducing the field independency of the correction effect. Directly in the pupil plane 38 the ratio P=∞.

Furthermore, it is not necessary that the correction element 32 is arranged in a plane which is exactly optically conjugate to the reference plane 48 in the sense that a very good imaging quality is achieved. In fact, even with a perfect position of the correction element 32 it is usually not possible to obtain a very good imaging quality for the following reason:

From FIG. 2 it is apparent that the optical conjugation achieved between the reference plane 48 and the pupil plane 38 uses optical elements (here the condenser 56) which are centered with respect to a first optical axis, and lenses (here the positive lens 34) which are centered with respect to a second optical axis, namely the optical axis 26 of the projection objective 20. Both optical axes do not coincide, but are, in this embodiment, parallel to each other. Only with not coinciding optical axes the image of the reference plane 48 will completely fill the usable pupil plane 38 (i.e. the portion within the aperture stop 43). This is because an on-axis reference plane 48 is, at least usually, not possible because the secondary illumination system 30, the condenser or a beam folding mirror (see second group of embodiments explained further below) would.

The desired property that the optical axis 26 of the projection objective 20 cannot coincide with an optical axis of optical elements arranged outside the beam path of the projection light entails that the imaging between the reference plane 48 and the pupil plane 38 will be subject to substantial aberrations. More specifically, the images 52a, 52b, 52c of the apertures 51, 51b, 51c, respectively, will usually be blurred.

However, it is not necessary to have the intensity distribution formed in the reference plane 48 sharply imaged on the correction element 32. Since the heat produced by the absorption of correction light in the correction element 32 "flows" away within the correction element 32 anyway, the temperature distribution in the correction element 32 will be "blurred", too.

If the demand for correction changes, for example if a new mask is to be projected with a different illumination setting, or the temperature distribution within the lenses contained in the projection objective 20 changes, the stop element 50 may be replaced with the help of the exchange holder 54 by another stop element having a different configuration of apertures. In certain cases, for example if the illumination setting is a major cause of time depending image errors, it may suffice to provide an operator of the projection exposure apparatus 10 with a small number of different stop elements 50 that are specifically adapted to the illumination settings. Such a set of stop elements form, together with the exchange holder 54, a simple light modulator 64 that makes it possible to vary the intensity distribution in the reference plane 48.

FIG. 3a is a top view on an exemplary stop element 50' which includes two trapezoidal apertures 51a', 51b' that are positioned on a diameter of the stop element 50' in an arrangement having a two-fold symmetry. Such a symmetry may be involved in order to correct wavefront deformations which are associated with astigmatic imaging errors.

In another embodiment the flexibility to produce the desired temperature distribution in the correction element 32 is further enhanced by being able to produce not only a zero or a non-zero intensity in the reference plane 48, but also a number of non-zero intensities. In other words, the intensity distribution in the reference plane 48 is not simply an arrangement of dark and bright spots, but contains areas of different brightness. Such a graded intensity may be used to reduce temperature gradients within the correction element 32.

FIG. 3b is a top view on another stop element denoted by 50" which realizes this concept. The stop element 50" includes two apertures 51a", 51b" which are also arranged on a diameter of the stop element 50". Semi-transparent areas 53a" and 53b" are arranged adjacent to opposite lateral sides of the apertures 51a" and 51b", respectively. The semitransparent areas 53a", 53b" have a transparency for the correction light which is neither 0% nor 100%, but somewhere in between, for example 50%.

Even a continuous or quasi-continuous intensity distribution within the reference plane 48 may be considered. Such multi-step or continuous intensity distributions may be obtained with grey filters as stop elements 50. The grey filters have a continuous or multi-step transmittance which is computed in order to achieve the desired temperature distribution in the correction element 32. This computation should also consider any residual attenuation of the correction light which occurs in the optical elements arranged between the reference plane 48 and the correction element 32.

In still another embodiment the flexibility to produce different temperature distributions in the correction element 32 is further increased by replacing the fixed stop elements 50 by an arrayed light source. FIG. 4 is a simplified meridional section through a secondary illumination system 30' according to another embodiment in which a large number of small light emitting elements 46' are arranged directly in the reference plane 48. A control unit 60' controls each light emitting element 46' individually so that almost any desired intensity distribution may be produced in the reference plane 48.

FIG. 5 is a top view of the light emitting elements 46' of the secondary illumination system 30' in an exemplary state of operation. The light emitting elements 46' produce a specific binary (i.e. on/off) intensity distribution which has been determined such that its image on the correction element 32 corrects image errors of the projection objective 20. In this embodiment the secondary light source 30' itself forms a modulator 64' that makes it possible to vary the intensity distribution in the reference plane 48.

Figure 6:
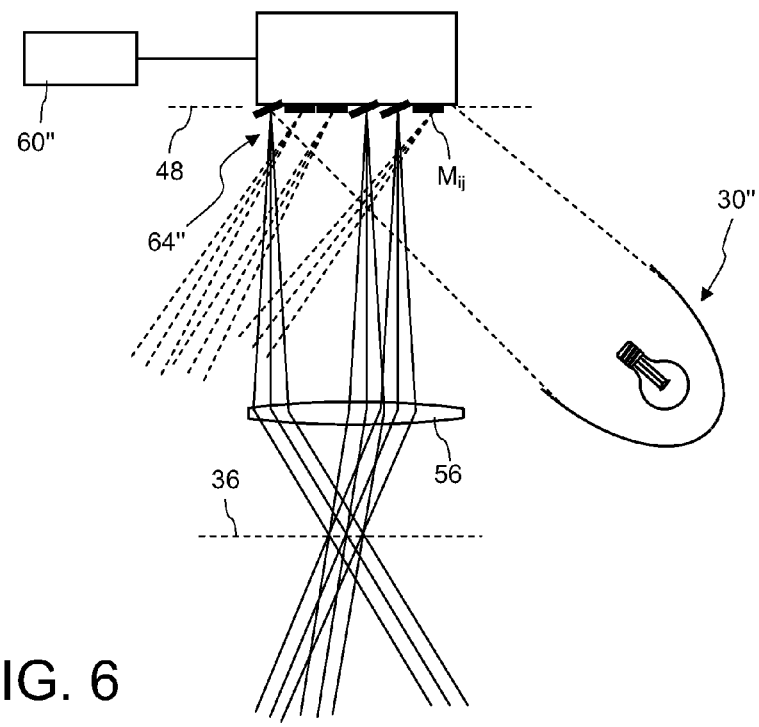
FIG. 6 is a meridional section through a secondary illumination system, a light modulator and a condenser of the correction optical system according to another embodiment of the correction optical system.
Figure 7:
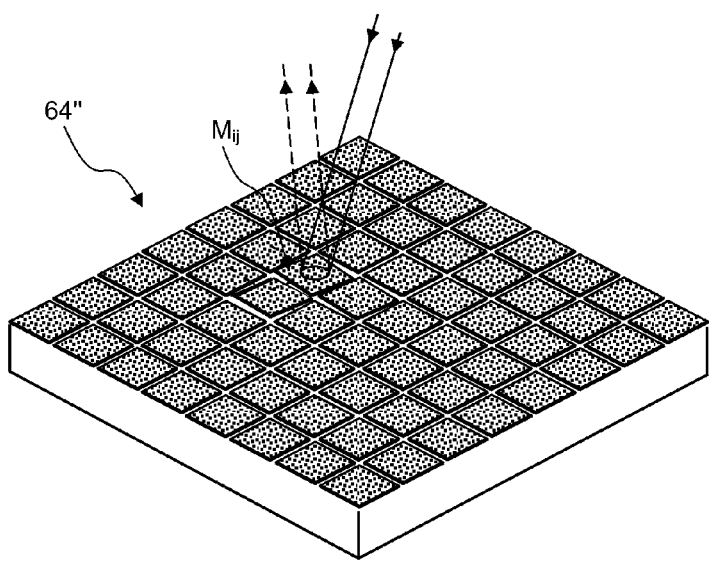
FIG. 7 is a perspective view of a mirror array contained in the illumination system shown in FIG. 6.

FIG. 6 is a meridional section through a secondary illumination system 30", a light modulator 64" and the condenser 56 according to still another embodiment. The light modulator 64" is realized as an array of tiltable mirror elements $M_{ij}$ which is also shown in a perspective view in FIG. 7. The mirror elements $M_{ij}$ are arranged directly in the reference plane 48 and are thus imaged onto the correction element 32. The light modulator 64" is illuminated by the secondary illumination system 30" and is controlled by a control unit 60".

The mirror elements $M_{ij}$ of the modulator 64" may be individually tilted such that they are either in an "on" or in an "off"-state. In an "on"-state a mirror element $M_{ij}$ directs the reflected light onto the condenser 56. In the "off"-state a mirror element $M_{ij}$ is tilted such that the reflected light does not reach the condenser 56. The modulator 64" may be configured as a micro-electromechanical system (MEMS) which may combine many thousands of micro-mirrors on an area of a few cm$^2$.

Figure 8:
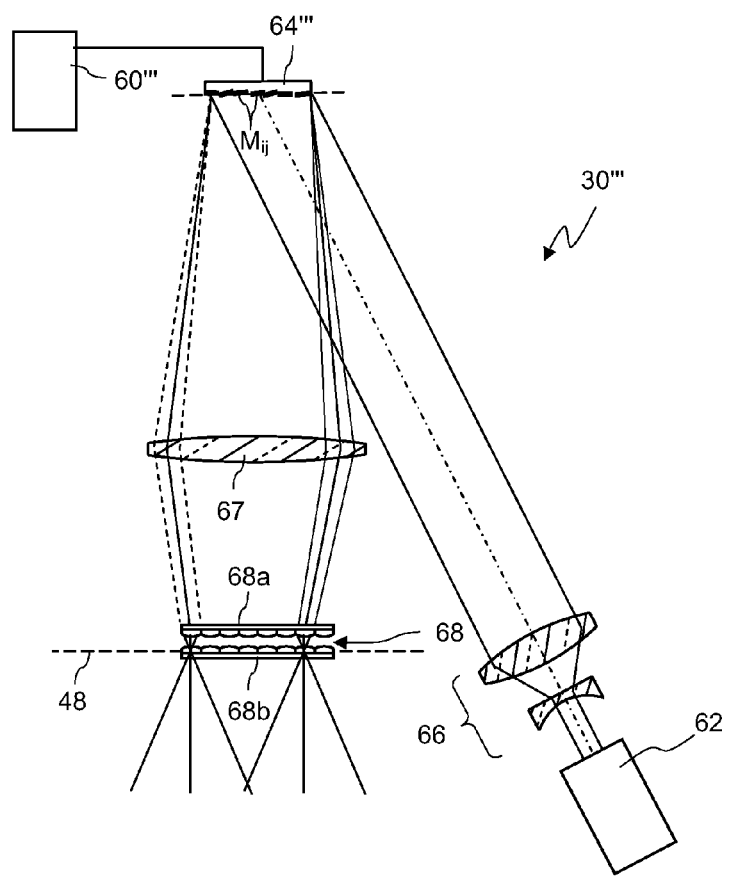
FIG. 8 is a meridional section through a secondary illumination system of the correction optical system in accordance with yet another embodiment.

FIG. 8 is a meridional section through a secondary illumination system 30'''. The secondary illumination system 30''' includes in this embodiment a laser 62 and a beam expansion unit 66 which produce a collimated bundle of correction light. This bundle illuminates mirror elements $M_{ij}$ of a modulator 64''' which is not contained within the secondary illumination system 30'. Correction light reflected from the mirror elements $M_{ij}$ passes through a positive lens 67 and impinges on an optical integrator 68 which is arranged in the reference plane 48. The optical integrator 68 of this embodiment includes two integrator elements 68a, 68b which each include two arrays of cylindrical microlenses arranged perpendicularly to each other. An optical integrator 68 may be used if the light emerging from the reference plane 48 shall have a very homogenous and well-defined angular distribution. A well-defined angular distribution may be advantageous particularly in those cases in which the coefficient of absorption of the correction element 32 depends on the angle of incidence.

The choice of any of the types of secondary illumination systems and modulators described above, or any other suitable optical systems that make it possible to variably illuminate the reference plane 48, will also depend on the wavelength or the range of wavelengths the correction light shall have. With respect to FIG. 2 it has been noted that in one embodiment the projection light has a wavelength of $\lambda=193$ nm and the correction light has a wavelength of $\lambda=157$ nm. For such short DUV wavelengths there are usually no light emitting elements available that could be arranged in an array as has been shown in FIG. 2 or FIGS. 4 and 5. Usually such a wavelength is produced using an excimer laser. For that reason a secondary illumination system similar to the one shown in FIG. 8 and denoted with 30''' may be more suitable.

In the case of correction light having a wavelength in the infrared spectral range, there are various laser diodes available that emit infrared radiation. For example, a (PbEu)Ee may be used which produces IR light having a wavelength between 7 and 7.3 µm. Laser diodes are particularly suitable for the embodiments shown in FIGS. 2 to 7. An Er laser emits light having a wavelength of 2.8 µm, and an YSGG (Yttrium Scandium Gallium Granat) laser produces radiation having a wavelength of about 2.94 µm. CO laser emit usually many hundreds spectral lines between 4.8 µm and 8.3 µm.

2. Second Group of Embodiments

Figure 9:
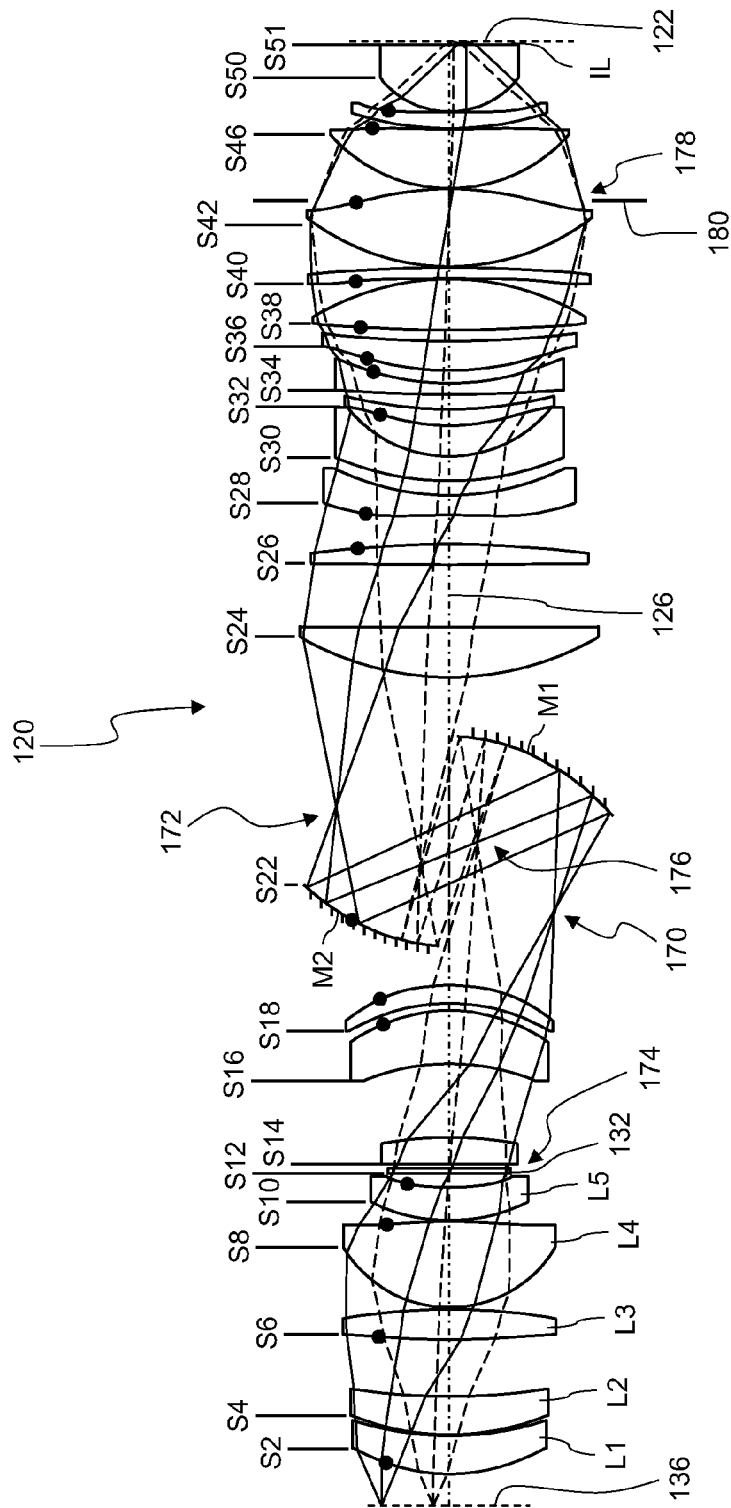
FIG. 9 is a meridional section through a realistic projection objective in which a correction element of the correction optical system is arranged.

FIG. 9 is a meridional section through a realistic projection objective 120 in a true to scale representation.

Between the mask plane 136 and an image plane 122 the projection objective 120 has two intermediate image planes denoted by 170 and 172. The intermediate image planes 170, 172 divide the projection objective 120 into three lens groups each containing one pupil plane. In FIG. 9, these pupil planes are denoted by 174, 176 and 178, respectively. A system aperture stop 180 is arranged in the third pupil plane 178, which is situated immediately behind a region of largest beam diameter.

The projection objective 120 includes in total 21 lenses and two concave mirrors M1, M2. The mirrors M1, M2 have aspherical surfaces and are arranged between the first and second intermediate image plane 170, 172.

In this embodiment the projection objective 120 is designed as an immersion objective. This means that, during operation of the projection exposure apparatus 10, the interspace between the last lens and the light sensitive layer 22 is filled with an immersion liquid IL. In this exemplary embodiment, a high index immersion liquid is used having a refractive index of about 1.65 at $\lambda$=193 nm.

The design specification of the projection objective 120 is given at the end of the description in tables 1 and 2. In table 1, the first column indicates the number # of the refractive or reflective surface. Some of these surface numbers # are denoted in FIG. 9 with reference numerals S#. The second column lists the radius of that surface, the third column indicates whether the surface is aspherical, and the fourth column lists the distance between that surface and the next surface. The fifth column lists the material of the optical element, wherein REFL indicates a reflective surface, HINDSOL represents LuAG (lutetium aluminum garnet) and HINDLIQ a high index second generation immersion liquid. The sixth column lists the refractive index of the material, and the seventh column list the optically utilizable clear semi-diameter of the optical element.

The surfaces listed in column 3 of table 1 and indicated in FIG. 9 with a dot (•) have an aspherical shape. Table 2 lists the aspherical constants k and $C_1$ to $C_9$ for those surfaces. The height z of a surface point parallel to the optical axis is given by $$z = \frac{ch^2}{1+\sqrt{1-(1+k)c^2h^2}} + C_1h^4 + C_2h^6 + C_3h^8 + C_4h^{10} + C_5h^{12} + C_6h^{14} + C_7h^{16} + C_8h^{18} + C_9h^{20}$$

with h being the radial distance from the optical axis and c=1/R being the curvature of the surface.

In the first pupil plane 174, i.e. between the fifth and the sixth lens of the projection objective 10, a correction element 132 is arranged which has again the shape of a plane parallel plate. The correction element 132 and all subsequent lenses along the propagation direction of the projection light are made of fused silica glass ($SiO_2$) in this embodiment. All lenses L1 to L5 arranged in front of the correction element 132 are made of calcium fluoride ($CaF_2$).

Figure 10:
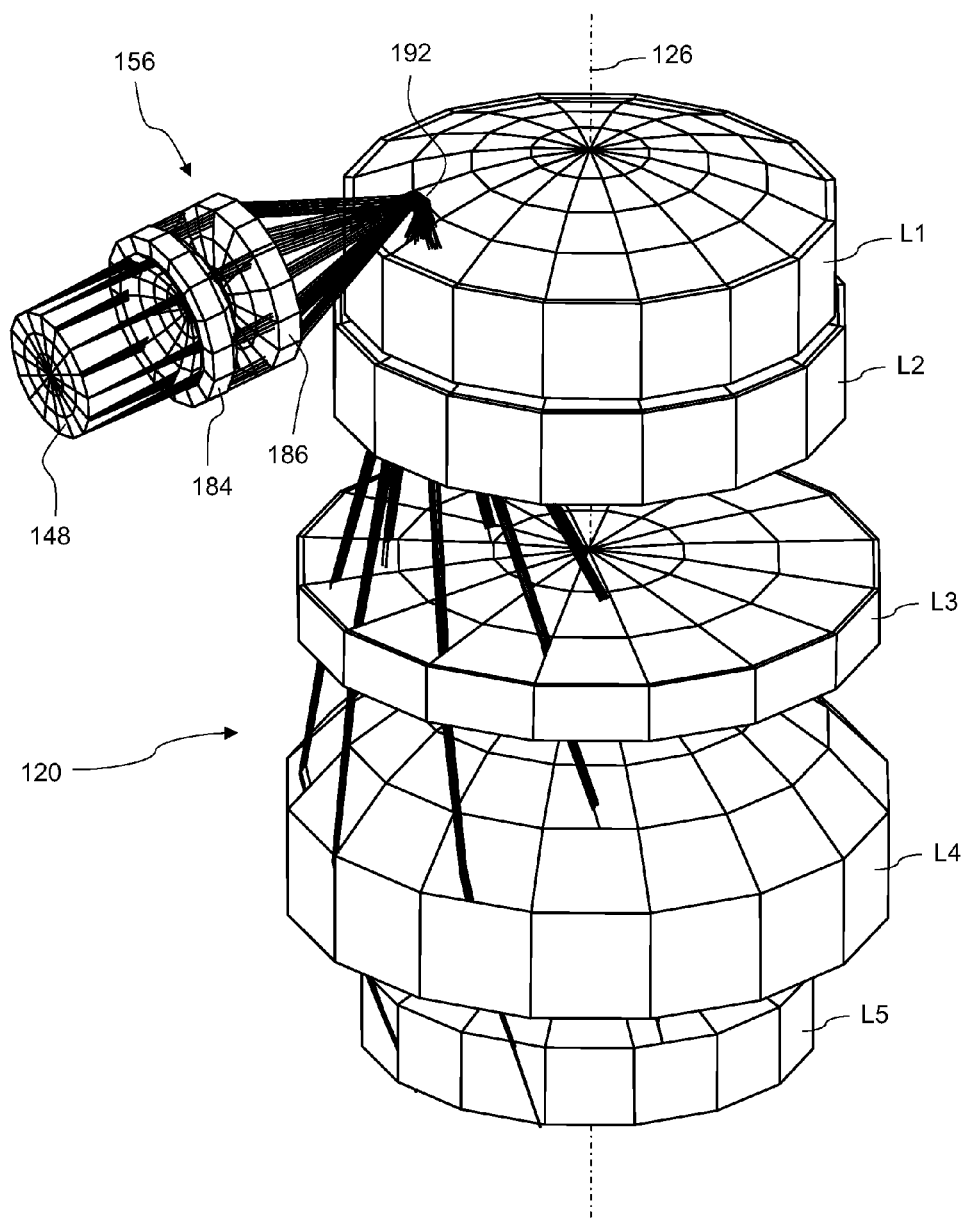
FIG. 10 is a perspective view of the correction optical system for the projection objective shown in FIG. 9.

FIG. 10 is a perspective view of the correction optical system which includes the first five lenses L1 to L5 of the projection objective 120. The lenses L1 to L5 are illustrated in grid representations in this perspective view. A meridional section of these components is given in FIG. 11.

Figure 11:
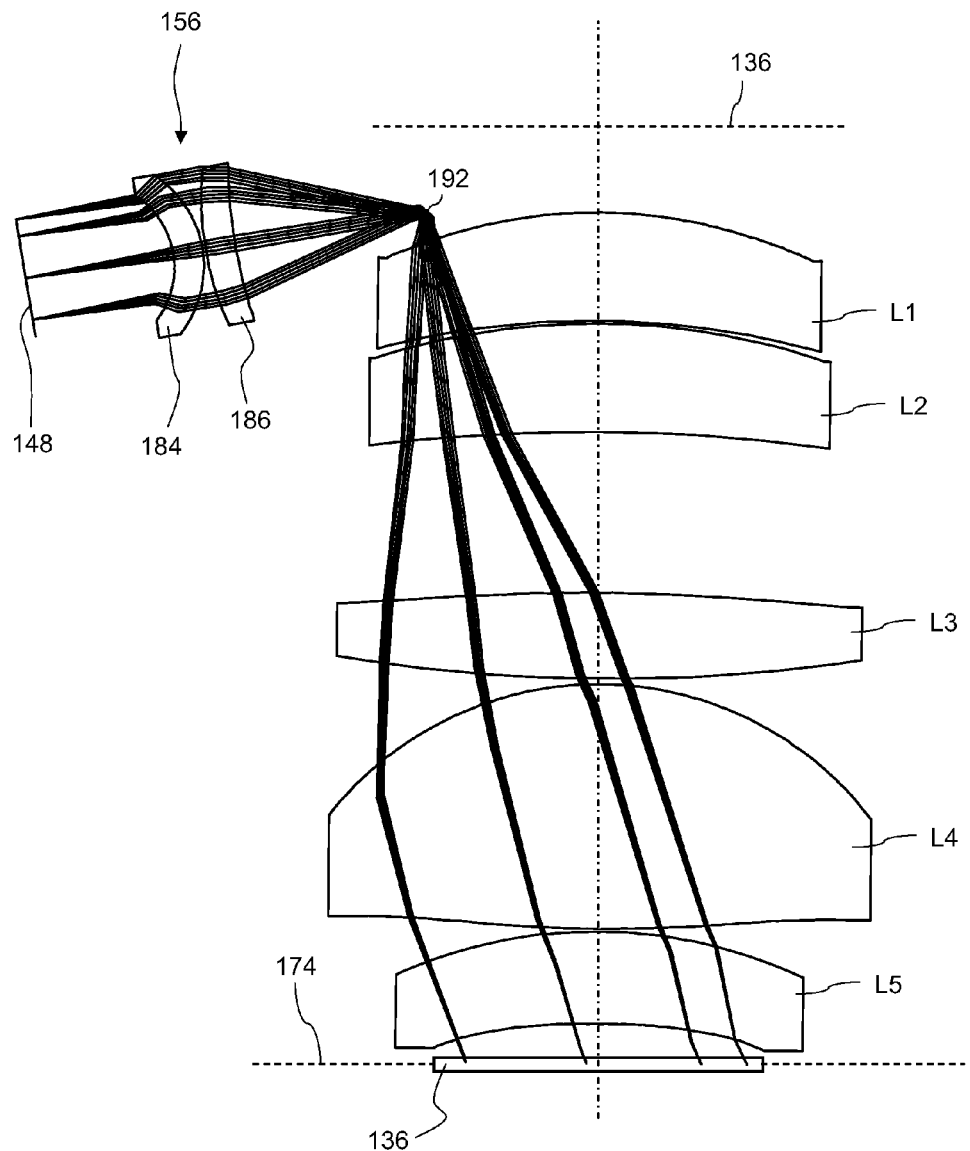
FIG. 11 is a meridional section through the correction optical system shown in FIG. 10.

In this embodiment an Er doped laser is assumed to be used in a secondary illumination system which is not shown in FIGS. 10 and 11. The Er doped laser produces correction light having a wavelength of about 2.8 µm. The secondary illumination system, which may be configured in a manner similar to what is shown in FIG. 8, illuminates the reference plane 148 such that the intensity distribution in this reference plane 148 can be varied.

The condenser 156 of the correction optical system includes two meniscus lenses 184, 186 which are made of Ge which has a high transmission coefficient for the wavelength of the correction light.

Figure 12:
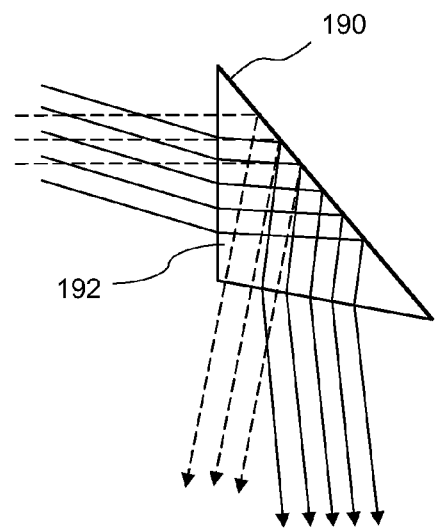
FIG. 12 is a meridional section through a beam folding element contained in the correction optical system shown in FIG. 10.

The collimated light bundles emerging from the condenser 156 superimpose on a plane reflective surface 190 of a beam folding element 192. The beam folding element 192, which is shown in a meridional section in FIG. 12, is configured as a prism made of Ge. The reflective surface 190 reflects rays of the correction light that entered the prism on one side by total internal reflection such that the rays leave the prism at the other side. The reflectivity of the surface 190 may be enhanced by applying an additional reflective coating on the prism. The beam folding element 192 is designed such that the angular correlation between the light rays impinging on the beam folding element 192 is maintained after the reflection at the reflective surface 190. This is illustrated in FIG. 12 with two collimated light bundles represented as solid lines and broken lines, respectively.

As becomes clear from the meridional section of FIG. 11, the beam folding element 192 is not positioned exactly in the mask plane 136, but at some distance apart from it. Thus the condenser 156 only approximately establishes a Fourier relationship between the reference plane 148 and the mask plane 136. As has been mentioned above, however, this deviation from the ideal case is tolerable, since the intensity distribution in the reference plane 148 does not have to be imaged on the correction element 136 sharply and free of aberrations.

Figure 13:
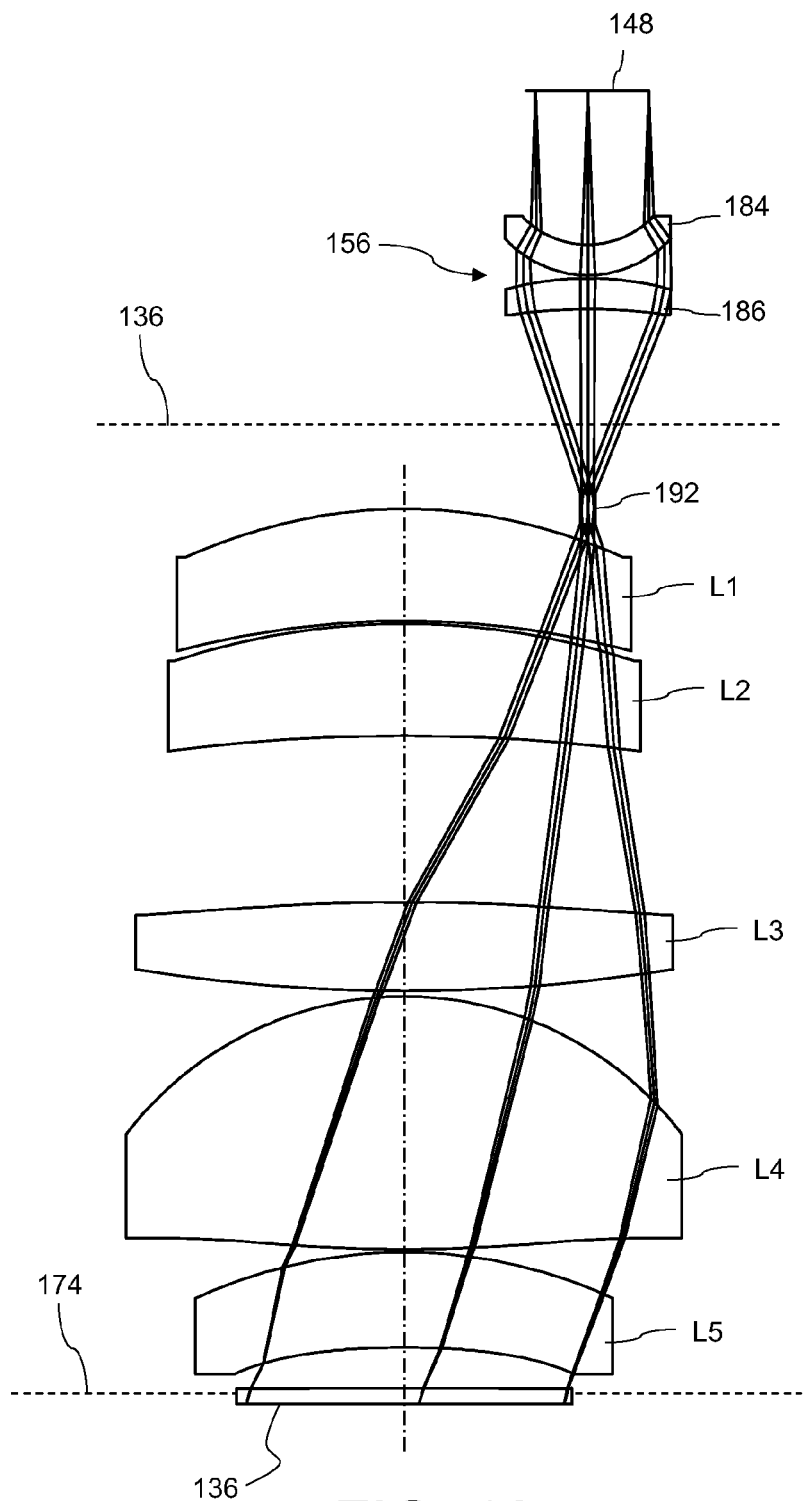
FIG. 13 is a representation similar to FIG. 11, but without the beam folding achieved by the beam folding element.
Figure 14:
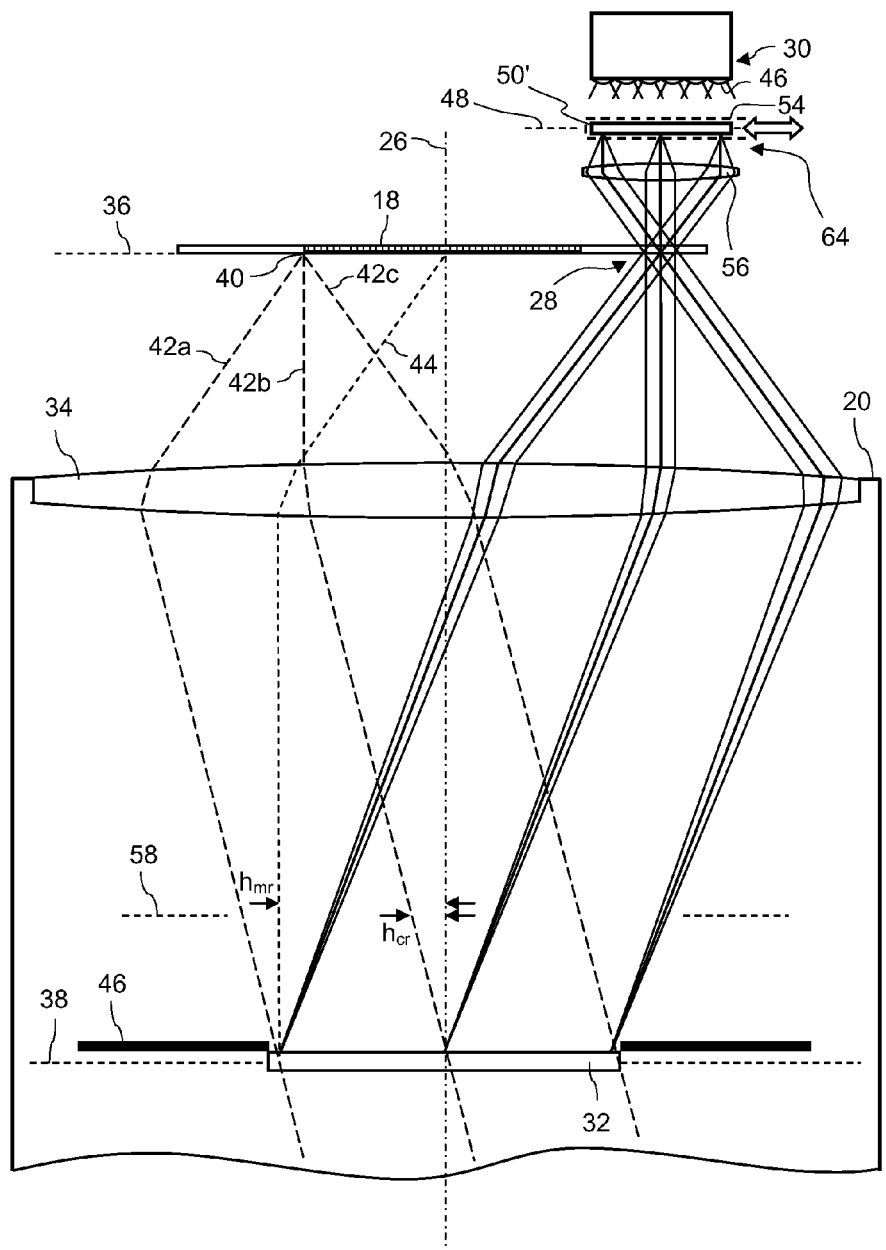
FIG. 14 is a meridional section through a correction optical system contained in the projection exposure apparatus shown in FIG. 1.

FIG. 13 is an illustration of the correction optical system similar to FIG. 11, but with the condenser 156 and the reference plane 148 tilted as if the beam folding element 190 was not present. If one compares this illustration with the embodiment shown in FIG. 2, it is apparent that the correction optical system of this embodiment functions substantially in the same manner as what has been described above with reference to the embodiment shown in FIG. 2. However, the beam folding element 192 makes it possible to arrange the secondary illumination system (not shown) and the condenser 156 below the mask plane 136 so that these optical elements do not obstruct the mask and a mask stage that moves and aligns the mask.

The design specification of the correction optical system shown in FIGS. 10 to 13 is given at the end of the description in tables 1 and 2. The table 3 contains the same quantities as have been explained above with reference to table 1. Since the lenses L1 to L5 contained in the projection objective 120 are also part of the correction optical system, their design specification is also contained in table 3.

The surfaces listed in column 3 of table 3 with a dot have an aspherical shape. Table 4 lists the aspherical constants for those surfaces.

It is to be understood that the disclosure may equally be used in other types of projection objectives, for example purely refractive objectives as disclosed in WO 2003/075096 A2 or catadioptric objectives of the kind described in WO 2004/019128 A2 or WO 2005/069055 A2.

The above description of the exemplary embodiments has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

TABLE 1

Objective Design Specification

| Surface # | Radius [mm] | Asphere | Thickness [mm] | Material | Index at $\lambda$ = 193.368 nm | ½ diameter [mm] |
|---|---|---|---|---|---|---|
| 0 | 0.000000 | | 29.999023 | AIR | 1.00000000 | 63.700 |
| 1 | 0.000000 | | −0.050962 | AIR | 1.00000000 | 76.371 |
| 2 | 162.540788 | • | 36.459230 | CAFUV | 1.50104068 | 85.969 |
| 3 | 286.316216 | | 0.906947 | AIR | 1.00000000 | 87.519 |
| 4 | 239.617308 | | 36.429846 | CAFUV | 1.50104068 | 88.629 |
| 5 | 591.567355 | | 54.085429 | AIR | 1.00000000 | 89.383 |
| 6 | 611.675718 | • | 28.914847 | CAFUV | 1.50104068 | 95.743 |
| 7 | −557.802530 | | 1.837386 | AIR | 1.00000000 | 96.558 |
| 8 | 114.434441 | | 82.273161 | CAFUV | 1.50104068 | 96.002 |
| 9 | −449.283278 | • | 0.975405 | AIR | 1.00000000 | 84.540 |
| 10 | 162.755184 | | 30.929964 | CAFUV | 1.50104068 | 70.404 |
| 11 | 272.822843 | • | 13.395792 | AIR | 1.00000000 | 55.753 |
| 12 | 0.000000 | | 5.000000 | SIO2V | 1.56078570 | 100.000 |
| 13 | 0.000000 | | 4.109813 | AIR | 1.00000000 | 53.937 |
| 14 | 0.000000 | | 25.336299 | SIO2V | 1.56078570 | 55.554 |
| 15 | −355.066644 | | 69.965982 | AIR | 1.00000000 | 60.419 |
| 16 | −206.891087 | | 51.192534 | SIO2V | 1.56078570 | 77.315 |
| 17 | −134.245139 | • | 6.546034 | AIR | 1.00000000 | 89.501 |
| 18 | −177.180785 | | 17.122977 | SIO2V | 1.56078570 | 90.876 |
| 19 | −185.517064 | • | 37.477450 | AIR | 1.00000000 | 93.990 |
| 20 | 0.000000 | | 199.804343 | AIR | 1.00000000 | 96.634 |
| 21 | −171.360334 | • | −199.804343 | REFL | 1.00000000 | 149.979 |
| 22 | 172.024621 | • | 199.804343 | REFL | 1.00000000 | 133.198 |
| 23 | 0.000000 | | 56.112910 | AIR | 1.00000000 | 118.623 |
| 24 | 271.929744 | | 47.944896 | SIO2V | 1.56078570 | 136.447 |
| 25 | 1268330.221500 | | 59.214916 | AIR | 1.00000000 | 135.410 |
| 26 | 9012.778293 | | 19.585025 | SIO2V | 1.56078570 | 126.711 |
| 27 | −684.283982 | • | 27.886776 | AIR | 1.00000000 | 125.717 |
| 28 | −726.436879 | • | 18.476731 | SIO2V | 1.56078570 | 114.367 |
| 29 | 235.190638 | | 14.171625 | AIR | 1.00000000 | 105.240 |
| 30 | 270.085388 | | 22.813296 | SIO2V | 1.56078570 | 103.636 |
| 31 | 120.974617 | | 29.293094 | AIR | 1.00000000 | 92.407 |
| 32 | 172.803839 | • | 15.938913 | SIO2V | 1.56078570 | 93.625 |
| 33 | 392.888081 | | 14.264379 | AIR | 1.00000000 | 94.903 |
| 34 | 1432.791704 | | 10.490986 | SIO2V | 1.56078570 | 97.156 |
| 35 | 257.349202 | • | 12.215823 | AIR | 1.00000000 | 103.308 |
| 36 | 257.740144 | | 28.205179 | SIO2V | 1.56078570 | 112.222 |
| 37 | 1055.534001 | | 9.990288 | AIR | 1.00000000 | 116.183 |
| 38 | 1109.715036 | • | 48.650716 | SIO2V | 1.56078570 | 121.797 |
| 39 | −243.150000 | | 0.894710 | AIR | 1.00000000 | 124.372 |
| 40 | −4699.099421 | • | 10.273993 | SIO2V | 1.56078570 | 128.263 |
| 41 | −1238.671077 | | 0.892471 | AIR | 1.00000000 | 128.742 |
| 42 | 213.611304 | | 73.813775 | SIO2V | 1.56078570 | 130.013 |
| 43 | −259.957584 | • | −10.831737 | AIR | 1.00000000 | 127.785 |
| 44 | 0.000000 | | −0.362185 | AIR | 1.00000000 | 123.262 |
| 45 | 0.000000 | | 11.964350 | AIR | 1.00000000 | 123.430 |
| 46 | 148.477098 | | 56.231628 | SIO2V | 1.56078570 | 108.665 |
| 47 | 714.548108 | • | 0.841673 | AIR | 1.00000000 | 104.536 |
| 48 | 300.400282 | | 15.107450 | SIO2V | 1.56078570 | 88.362 |
| 49 | −7493.575725 | • | 0.821009 | AIR | 1.00000000 | 81.805 |
| 50 | 81.635599 | | 63.114483 | HINDSOL | 2.15000000 | 61.464 |
| 51 | 0.000000 | | 3.100000 | HINDLIQ | 1.65002317 | 24.625 |
| 52 | 0.000000 | | 0.000000 | | 0.00000000 | 15.926 |

TABLE 2

Objective Aspheric Constants

| | Surface # | | | | |
|---|---|---|---|---|---|
| | 2 | 6 | 9 | 11 | 17 |
| K | 0 | 0 | 0 | 0 | 0 |
| C1 | −2.861166e−08 | −3.336785e−08 | 3.352771e−08 | 2.817847e−07 | 1.180309e−07 |
| C2 | −1.962230e−13 | −1.479746e−12 | 1.745195e−11 | −1.818432e−11 | −5.169645e−12 |
| C3 | −2.527107e−17 | 2.428505e−16 | −2.493178e−15 | 7.209744e−15 | 5.555993e−16 |

TABLE 2-continued

Objective Aspheric Constants

|    |                |                |                |                |                |
|----|----------------|----------------|----------------|----------------|----------------|
| C4 | −7.639741e−21  | −1.386888e−20  | 2.674239e−19   | 4.248172e−19   | −7.065744e−20  |
| C5 | 4.819493e−25   | 1.633134e−24   | −1.932735e−23  | −4.306273e−22  | 4.752951e−24   |
| C6 | −1.239021e−29  | −7.291620e−29  | 5.956747e−28   | 1.925501e−25   | −2.294494e−28  |
| C7 | 0.000000e+00   | 0.000000e+00   | 0.000000e+00   | 0.000000e+00   | 0.000000e+00   |
| C8 | 0.000000e+00   | 0.000000e+00   | 0.000000e+00   | 0.000000e+00   | 0.000000e+00   |
| C9 | 0.000000e+00   | 0.000000e+00   | 0.000000e+00   | 0.000000e+00   | 0.000000e+00   |

Surface #

|    | 19             | 21             | 22             | 27             | 28             |
|----|----------------|----------------|----------------|----------------|----------------|
| K  | 0              | −1.90513       | −1.34151       | 0              | 0              |
| C1 | −1.000639e−07  | −3.437019e−08  | 1.947252e−08   | 1.911061e−08   | 1.806107e−07   |
| C2 | 4.915210e−12   | 2.619191e−13   | 3.025235e−14   | 8.601576e−13   | −7.048097e−12  |
| C3 | −5.993923e−16  | −7.361057e−18  | 1.211486e−18   | −1.354121e−16  | 3.133322e−16   |
| C4 | 6.039386e−20   | 1.075009e−22   | 1.330630e−24   | 3.856430e−21   | −1.953267e−20  |
| C5 | −4.083105e−24  | −1.770648e−27  | −5.016884e−28  | −1.136767e−26  | 7.609848e−25   |
| C6 | 1.800718e−28   | 5.412364e−33   | 1.517670e−32   | −7.407626e−31  | −1.752769e−29  |
| C7 | 0.000000e+00   | 0.000000e+00   | 0.000000e+00   | 0.000000e+00   | 0.000000e+00   |
| C8 | 0.000000e+00   | 0.000000e+00   | 0.000000e+00   | 0.000000e+00   | 0.000000e+00   |
| C9 | 0.000000e+00   | 0.000000e+00   | 0.000000e+00   | 0.000000e+00   | 0.000000e+00   |

Surface #

|    | 32             | 35             | 36             | 38             | 40             |
|----|----------------|----------------|----------------|----------------|----------------|
| K  | 0              | 0              | 0              | 0              | 0              |
| C1 | −7.670168e−08  | 7.070170e−08   | −5.587568e−09  | −4.291671e−09  | −4.966644e−08  |
| C2 | −4.136842e−12  | −7.771232e−12  | −1.930912e−12  | −1.306467e−13  | 1.050857e−13   |
| C3 | −2.235834e−16  | 7.971682e−17   | 2.083898e−16   | −1.284843e−16  | 1.576396e−16   |
| C4 | 6.888603e−21   | 5.188689e−21   | −2.190658e−20  | 9.303940e−21   | −1.824778e−21  |
| C5 | −4.005533e−25  | 9.647622e−25   | 7.637049e−25   | 1.233400e−25   | 1.142929e−25   |
| C6 | 1.985126e−29   | −4.805718e−29  | −1.412857e−29  | −1.014037e−29  | −7.112480e−30  |
| C7 | 0.000000e+00   | 0.000000e+00   | 0.000000e+00   | 0.000000e+00   | 0.000000e+00   |
| C8 | 0.000000e+00   | 0.000000e+00   | 0.000000e+00   | 0.000000e+00   | 0.000000e+00   |
| C9 | 0.000000e+00   | 0.000000e+00   | 0.000000e+00   | 0.000000e+00   | 0.000000e+00   |

Surface #

|    | 43             | 47             | 49             |
|----|----------------|----------------|----------------|
| K  | 0              | 0              | 0              |
| C1 | 3.077721e−08   | −1.514981e−07  | 1.440002e−07   |
| C2 | 1.025175e−12   | 9.911505e−12   | 2.276066e−12   |
| C3 | 1.702741e−17   | −4.847033e−17  | −2.396053e−16  |
| C4 | −1.054969e−21  | −3.422137e−20  | 9.816847e−20   |
| C5 | −1.016914e−26  | 2.095814e−24   | −9.282521e−24  |
| C6 | 1.653621e−30   | −4.020899e−29  | 8.425198e−28   |
| C7 | 0.000000e+00   | 0.000000e+00   | 0.000000e+00   |
| C8 | 0.000000e+00   | 0.000000e+00   | 0.000000e+00   |
| C9 | 0.000000e+00   | 0.000000e+00   | 0.000000e+00   |

TABLE 3

Secondary Illumination System
Design Specification

| Surface # | Radius [mm] | Asphere | Thickness [mm] | Material | Index at $\lambda$ = 2800.000 nm | ½ diameter [mm] |
|-----------|-------------|---------|----------------|----------|----------------------------------|-----------------|
| 0  | 0.000000    |   | 50.000000   | AIR  | 1.00000000 | 20.000 |
| 1  | 0.000000    |   | 0.000000    | AIR  | 1.00000000 | 21.518 |
| 2  | −29.574011  |   | 10.000000   | GERM | 4.05156888 | 21.518 |
| 3  | −33.869948  | • | 1.000000    | AIR  | 1.00000000 | 27.073 |
| 4  | 131.523573  | • | 10.000000   | GERM | 4.05156888 | 26.885 |
| 5  | 172.841617  |   | 60.000000   | AIR  | 1.00000000 | 24.880 |
| 6  | −1584.220650 |  | 5.000000    | GERM | 4.05156888 | 2.498  |
| 7  | 0.000000    |   | −5.000000   | REFL | 4.05156888 | 2.044  |
| 8  | 0.000000    |   | 5.000000    | AIR  | 1.00000000 | 2.496  |
| 9  | −162.540788 | • | −36.459230  | CAFUV | 1.41931807 | 71.471 |
| 10 | −286.316216 |   | −0.906947   | AIR  | 1.00000000 | 74.227 |
| 11 | −239.617308 |   | −36.429846  | CAFUV | 1.41931807 | 75.177 |
| 12 | −591.567355 |   | −54.085429  | AIR  | 1.00000000 | 77.166 |
| 13 | −611.675718 | • | −28.914847  | CAFUV | 1.41931807 | 86.320 |

TABLE 3-continued

Secondary Illumination System
Design Specification

| Surface # | Radius [mm] | Asphere | Thickness [mm] | Material | Index at $\lambda$ = 2800.000 nm | ½ diameter [mm] |
|---|---|---|---|---|---|---|
| 14 | 557.802530 | | −1.837386 | AIR | 1.00000000 | 87.891 |
| 15 | −114.434441 | | −82.273161 | CAFUV | 1.41931807 | 90.814 |
| 16 | 449.283278 | • | −0.975405 | AIR | 1.00000000 | 79.094 |
| 17 | −162.755184 | | −30.929964 | CAFUV | 1.41931807 | 68.180 |
| 18 | −272.822843 | • | −13.395792 | AIR | 1.00000000 | 55.279 |
| 19 | 0.000000 | | 0.000000 | AIR | 0.00000000 | 13.000 |

TABLE 4

Secondary Illumination System
Aspheric Constants

| | Surface # | | | | | |
|---|---|---|---|---|---|---|
| | 3 | 4 | 9 | 13 | 16 | 18 |
| K | 0 | 0 | 0 | 0 | 0 | 0 |
| C1 | 4.922290e−06 | 4.886818e−06 | 2.861166e−08 | 3.336785e−08 | −3.352771e−08 | −2.817847e−07 |
| C2 | −6.047661e−09 | −9.334044e−09 | 1.962230e−13 | 1.479746e−12 | −1.745195e−11 | 1.818432e−11 |
| C3 | 4.577308e−12 | 8.921681e−12 | 2.527107e−17 | −2.428505e−16 | 2.493178e−15 | −7.209744e−15 |
| C4 | −2.554513e−22 | −3.398610e−15 | 7.639741e−21 | 1.386888e−20 | −2.674239e−19 | −4.248172e−19 |
| C5 | 1.000000e−51 | 1.000000e−51 | −4.819493e−25 | −1.633134e−24 | 1.932735e−23 | 4.306273e−22 |
| C6 | 0.000000e+00 | 0.000000e+00 | 1.239021e−29 | 7.291620e−29 | −5.956747e−28 | −1.925501e−25 |
| C7 | 0.000000e+00 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 | 0.000000e+00 |

What is claimed is:

1. An apparatus, comprising:
a primary illumination system configured to produce an intensity distribution of projection light in a mask plane;
a projection objective comprising a lens; and
a correction optical system, comprising:
a secondary illumination system configured to produce a variable intensity distribution of correction light in a reference surface; and
a correction element comprising a heating material, the correction element being in a plane that is at least substantially optically conjugate to the reference surface so that the correction light and the projection light pass through the lens of the projection objective before they impinge on the correction element,
wherein:
all lenses through which both the correction light and the projection light pass comprise one or more lens materials having a lower coefficient of absorption for the correction light than the heating material,
the correction optical system is configured to heat the entire correction element, and
the apparatus is a microlithographic projection exposure apparatus.

2. The apparatus of claim 1, wherein, for the correction light, a coefficient of absorption of the heating material is at least two times greater than a highest coefficient of absorption of a lens material through which the correction light passes.

3. The apparatus of claim 1, wherein, for the correction light, a coefficient of absorption of the heating material is at least five times greater than a highest coefficient of absorption of a lens material through which the correction light passes.

4. The apparatus of claim 1, wherein the projection light is selected so that a layer to be disposed in an image plane of the projection objective is sensitive to the projection light, and wherein the correction light is selected so that the layer to be disposed in the image plane of the projection objective is insensitive to the correction light.

5. The apparatus of claim 1, wherein the projection light and the correction light have different wavelengths.

6. The apparatus of claim 1, wherein the heating material comprises a synthetic quartz glass having a OH concentration of more than 500 ppm, and the correction light has a light component with a wavelength between 2.65 μm and 2.85 μm.

7. The apparatus of claim 1, wherein the correction element is a refractive optical element.

8. The apparatus of claim 7, wherein the correction element comprises a substrate configured as a plane parallel plate.

9. The apparatus of claim 1, wherein the correction element is arranged in, or in close proximity to, a pupil plane of the projection objective.

10. The apparatus of claim 9, wherein close proximity is defined by axial distances from the pupil plane at which the ratio $P=h_{mr}/h_{cr}>3$, wherein $h_{mr}$ is the height of a marginal ray that emerges from a point on an optical axis of the projection objective, and $h_{cr}$ is the height of a chief ray that impinges on a marginal image point.

11. The apparatus of claim 10, wherein $P>5$.

12. The apparatus of claim 1, wherein the correction optical system comprises a condenser through which only the correction light is allowed to propagate during use of the apparatus.

13. The apparatus of claim 12, wherein the condenser establishes a Fourier relationship between the reference surface and the mask plane or a plane which is optically conjugate to the mask plane.

14. The apparatus of claim 1, wherein the correction optical system comprises a beam folding element that feeds the correction light into a beam path of the projection objective.

15. The apparatus of claim 14, wherein the beam folding element comprises a mirror or a prism.

16. The apparatus of claim 1, wherein the correction optical system comprises a spatial light modulator that is configured to vary the intensity distribution in the reference surface.

17. The apparatus of claim 1, wherein the correction optical system comprises an optical integrator having a light exit surface arranged at least substantially in the reference surface.

18. The apparatus of claim 1, wherein the correction optical system is configured to heat portions of the correction element.

19. A method, comprising:
producing a variable intensity distribution of correction light in a reference surface;
imaging the reference surface onto a correction element in a projection objective of a microlithographic projection exposure apparatus, and
using a correction optical system, the correction optical system being configured to heat the entire correction element,
wherein both projection light of the microlithographic projection exposure apparatus and the correction light pass through at least one lens of the projection objective before they impinge on the correction element, and the correction light is more strongly absorbed in the correction element than in any lens through which both the correction light and the projection light pass.

20. The method of claim 19, wherein the correction optical system is configured to heat portions of the correction element.

21. An apparatus, comprising:
a projection objective comprising a lens; and
a correction optical system, comprising:
a light modulator system configured to produce a variable intensity distribution of correction light in a reference surface; and
a correction element in a plane that is at least substantially optically conjugate to the reference surface so that the correction light and a projection light pass through the lens of the projection objective before they impinge on the correction element,
wherein:
the correction optical system is configured to heat the entire correction element; and
the apparatus is a microlithographic projection exposure apparatus.

22. The apparatus of claim 21, wherein the light modulator system is configured to produce at least two different non-zero intensities at a plurality of points in the reference surface.

23. The apparatus of claim 21, wherein the correction optical system is configured to heat portions of the correction element.

* * * * *